US012217935B2

(12) United States Patent
Chen et al.

(10) Patent No.: US 12,217,935 B2
(45) Date of Patent: Feb. 4, 2025

(54) PLASMA PROCESSING METHODS USING MULTIPHASE MULTIFREQUENCY BIAS PULSES

(71) Applicant: Tokyo Electron Limited, Tokyo (JP)

(72) Inventors: Ya-Ming Chen, Austin, TX (US); Shyam Sridhar, Austin, TX (US); Peter Lowell George Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 444 days.

(21) Appl. No.: 17/807,076

(22) Filed: Jun. 15, 2022

(65) Prior Publication Data

US 2023/0411116 A1 Dec. 21, 2023

Related U.S. Application Data

(60) Provisional application No. 63/344,595, filed on May 22, 2022.

(51) Int. Cl.
*H01J 37/32* (2006.01)
(52) U.S. Cl.
CPC .......... *H01J 37/32018* (2013.01); *H01J 37/32165* (2013.01); *H01J 2237/334* (2013.01)
(58) Field of Classification Search
None
See application file for complete search history.

(56) References Cited

U.S. PATENT DOCUMENTS

| | | |
|---|---|---|
| 6,093,332 A | 7/2000 | Winniczek et al. |
| 6,916,746 B1 | 7/2005 | Hudson et al. |
| 8,404,598 B2 | 3/2013 | Liao et al. |
| 9,754,767 B2* | 9/2017 | Kawasaki ......... H01J 37/32155 |
| 9,872,373 B1* | 1/2018 | Shimizu ............ H01J 37/32146 |
| 10,847,368 B2 | 11/2020 | Kong et al. |
| 2004/0025791 A1 | 2/2004 | Chen et al. |
| 2005/0112891 A1 | 5/2005 | Johnson et al. |
| 2005/0136682 A1 | 6/2005 | Hudson et al. |
| 2011/0031216 A1* | 2/2011 | Liao ................. H01L 21/31116 216/67 |
| 2014/0213062 A1* | 7/2014 | Shimizu .............. B81C 1/00531 438/719 |
| 2014/0265852 A1* | 9/2014 | Valcore, Jr. ......... H01J 37/3299 315/111.21 |
| 2015/0072530 A1* | 3/2015 | Kim .................. H01L 21/31116 438/703 |
| 2017/0084432 A1* | 3/2017 | Valcore, Jr. ....... H01J 37/32146 |
| 2017/0099722 A1* | 4/2017 | Kawasaki ............... H05H 1/46 |
| 2017/0316940 A1* | 11/2017 | Ishikawa ............ H01L 21/0234 |

(Continued)

*Primary Examiner* — Allan W. Olsen
(74) *Attorney, Agent, or Firm* — Slater Matsil, LLP

(57) ABSTRACT

A plasma processing method includes generating a plasma within a processing chamber using source power to ignite a glow phase of the plasma, generating low-energy ions at a substrate supported by a substrate holder in the processing chamber from the plasma using lower-frequency radio frequency bias power applied during the glow phase, and generating high-energy ions at the substrate using higher-frequency radio frequency bias power applied during an afterglow phase of the plasma. The frequency of the higher-frequency radio frequency bias power is greater than the frequency of the lower-frequency radio frequency bias power.

20 Claims, 6 Drawing Sheets

(56) References Cited

U.S. PATENT DOCUMENTS

2021/0242309 A1 8/2021 Hsieh et al.
2021/0320012 A1 10/2021 Shimizu et al.
2021/0407812 A1 12/2021 Lin et al.

* cited by examiner

PLASMA PROCESSING METHODS USING MULTIPHASE MULTIFREQUENCY BIAS PULSES

CROSS-REFERENCE TO RELATED APPLICATIONS

This application claims priority to U.S. Provisional Application No. 63/344,595, filed on May 22, 2022, which application is hereby incorporated by reference in its entirety.

TECHNICAL FIELD

The present invention relates generally to plasma processing, and, in particular embodiments, to plasma processing methods, apparatuses, and systems using multiphase multifrequency bias pulses.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are commonly used to form devices, interconnects, and contacts in microelectronic workpieces. For example, plasma etching and plasma deposition are common process steps during semiconductor device fabrication. A combination of source power (SP) applied to a coupling element and bias power (BP) applied to a substrate holder can be used to generate and direct plasma. Various conditions during a plasma process may influence whether material is being deposited onto a substrate, etched from the substrate, or a combination of the two.

However, conventional plasma processes fail to independently control etching and deposition during plasma processes resulting in reduced control and precision of the processes. For example, in the specific example of etching processes, some deposition can be useful to protect features that are not the target of the etch. But because conventional plasma processes lack independent and precise control over both deposition and etching, these features are insufficiently protected. Thus, material is undesirably removed from the features causing imperfections in feature profile such as recesses in the tops of features and necking, among others. Therefore, plasma processing methods that enable independent control over deposition and etching may be desirable.

SUMMARY

In accordance with an embodiment of the invention, a plasma processing method includes generating a plasma within a processing chamber using source power to ignite a glow phase of the plasma, generating low-energy ions at a substrate supported by a substrate holder in the processing chamber from the plasma using lower-frequency radio frequency (RF) bias power (LBP) applied during the glow phase, and generating high-energy ions at the substrate using higher-frequency RF bias power (HBP) applied during an afterglow phase of the plasma. The RF frequency of the HBP is greater than the RF frequency of the LBP.

In accordance with another embodiment of the invention, a plasma etching method includes generating low-energy ions at a substrate supported by a substrate holder within a processing chamber by concurrently coupling both a source power (SP) pulse and an LBP pulse to a plasma within a processing chamber for an LBP pulse duration, and etching the substrate by applying an HBP pulse to the substrate holder for an HBP pulse duration after the LBP pulse duration without applying source power to the processing chamber. The RF frequency of the HBP pulse is greater than the RF frequency of the LBP pulse.

In accordance with still another embodiment of the invention, a plasma processing method includes etching a substrate supported by a substrate holder within a processing chamber by cyclically performing a periodic process comprising the following steps: applying an SP pulse to an SP coupling element to generate plasma within a processing chamber; applying an LBP pulse to the substrate holder to selectively deposit passivating species to top surfaces of features of the substrate; and applying an HBP pulse to the substrate holder without coupling source power to the SP coupling element to etch the substrate. The LBP pulse is coupled to the substrate holder while applying the SP pulse to the SP coupling element. The RF frequency of the HBP pulse is greater than the RF frequency of the LBP pulse.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a schematic timing diagram of the plasma processing method and FIG. 1B illustrates a corresponding target substrate;

Figure 1A:
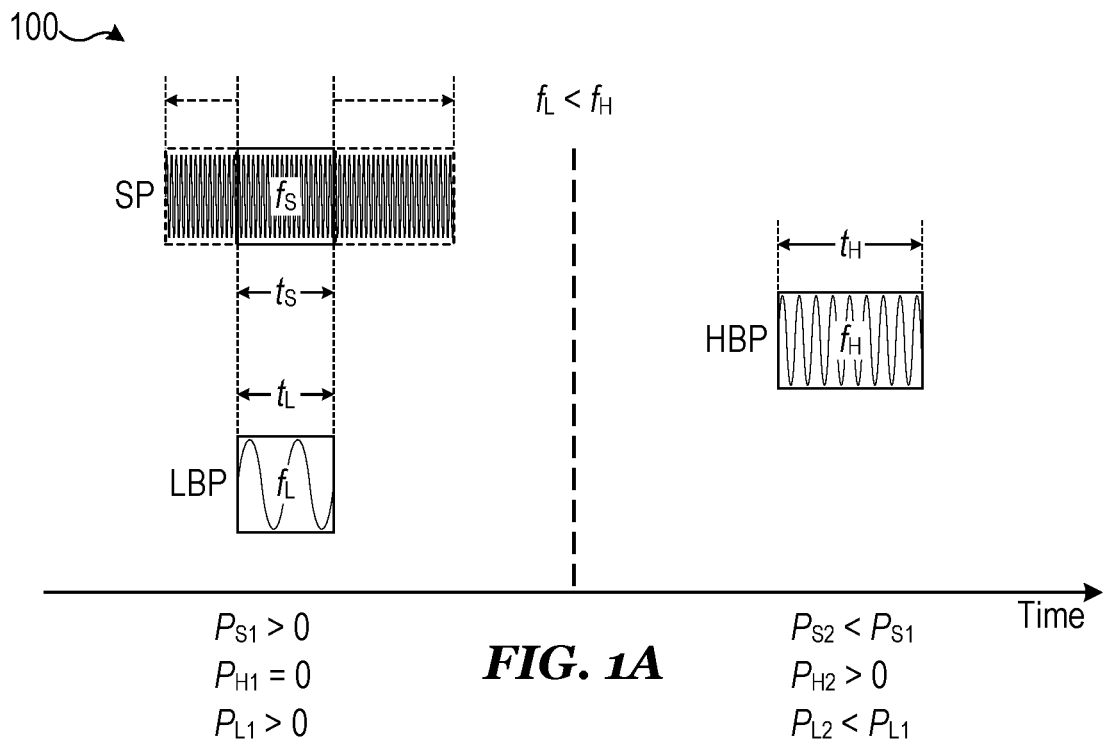
FIGS. 1A and 1B illustrate an example plasma processing method in accordance with embodiments of the invention, where

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Both the source power and bias power may be supplied as radio frequency (RF) power to the processing chamber of a plasma processing apparatus. Pulsed plasma processing methods supply one or both of the RF source power and RF bias power to a processing chamber as pulses rather than as continuous wave power. For example, BP pulses may be provided synchronously or asynchronously with SP pulses. Such existing synchronous/asynchronous schemes often use a single RF frequency for the bias power, even when supplying the bias power asynchronously (e.g. single frequency, dual-phase), and are not adequate to independently control etching and deposition.

Some conventional methods mix RF frequencies to shape the waveform of the BP pulses, but such methods are employed to influence plasma uniformity and do not afford independent control over deposition and etching.

Other conventional methods supply BP pulses with high RF frequency and high power along with the SP pulses and low RF frequency, low power BP pulses with very short duration in between SP pulses to avoid plasma generation and heating. However, the high RF frequency BP pulses may not allow fine control over deposition while the source power is due to generation of high-energy ions with significant verticality. Meanwhile, the low RF frequency BP pulses are intended to minimize any disruption to the plasma structure and therefore may lack the flexibility necessary for full control over etching.

In various embodiments, plasma processing methods described herein apply BP pulses with multiple RF frequencies across multiple phases. Unlike conventional methods, this multiphase, multifrequency bias pulsing may advantageously facilitate independent control over deposition and etching during a plasma process. For example, passivating species may be deposited with precision using lower-frequency RF bias power applied prior to an etch phase that uses higher-frequency RF bias power. Tune of pulse durations and frequencies may afford the ability to optimize deposition to within 2-3 atoms (e.g. approaching monolayer) variation, for example. In this way, Separate etching and deposition phases may be advantageously realized in one pulsing scheme.

This may have the advantage allowing features to be adequately protected during etching phases of the plasma process. The lower-frequency RF bias power may be applied concurrently with source power to generate low-energy ions at a substrate. The low-energy ions may have the benefit of being substantially thermal allowing the selective deposition of passivating species at top surfaces of features through ion-assisted deposition mechanisms.

For example, in the specific application of a soft-landing step for gate etching a FinFET device, a highly anisotropic etch profile may be achieved without significant damage to the fin. This may be particularly beneficial since device performance is strongly dependent on fin shape (e.g. the amount of fin recess). With the plasma processing methods described herein, fin recess may be advantageously reduced (e.g. by 45%) over conventional continuous wave or single frequency processes.

Figure 1B:
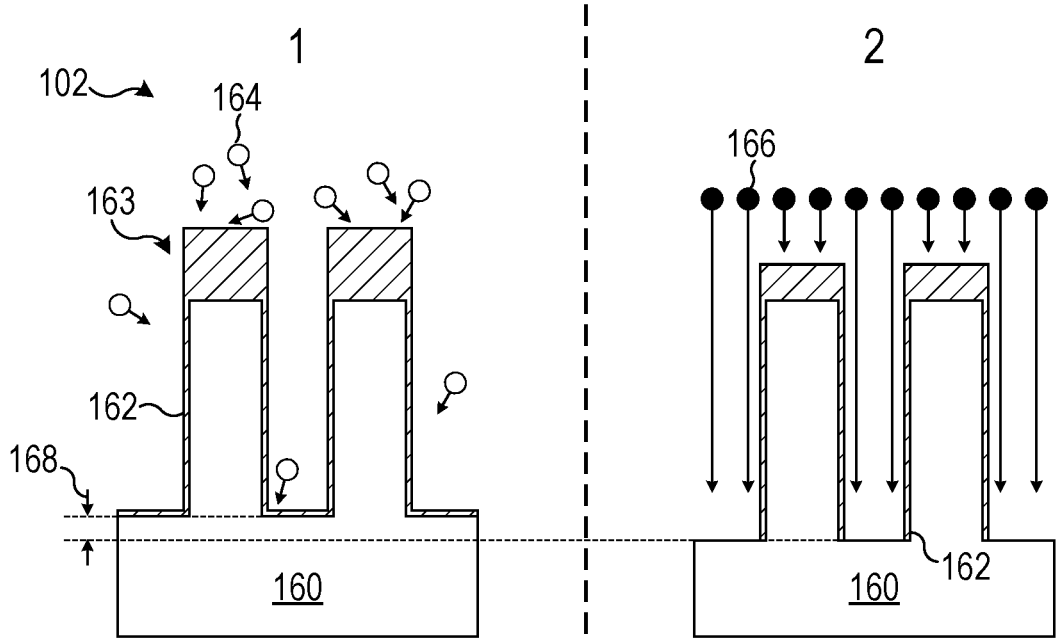

Embodiments provided below describe various plasma processing methods, apparatuses, and systems, and in particular, that include plasma processing methods, apparatuses, and systems using multiphase multifrequency bias pulses that apply lower-frequency RF bias power during a deposition phase and higher-frequency RF bias power during an etch phase. The following description describes the embodiments. FIGS. 1A and 1B, showing a schematic timing diagram and a corresponding target substrate, are used to describe an embodiment plasma processing method. Two additional embodiment plasma processing methods are described using FIGS. 2 and 3. An embodiment plasma processing apparatus is described using FIG. 4. Three embodiment methods of plasma processing are described using FIGS. 5-7.

FIGS. 1A and 1B illustrate an example plasma processing method in accordance with embodiments of the invention, where FIG. 1A illustrates a schematic timing diagram of the plasma processing method and FIG. 1B illustrates a corresponding target substrate.

Referring to FIG. 1A, a plasma processing method wo includes a first phase 1 during which an SP pulse with an RF frequency $f_S$ and an SP pulse duration $t_S$ is applied concurrently with a BP pulse with lower-frequency RF frequency $f_L$ (an LBP pulse) for an LBP pulse duration $t_L$. In some embodiments, SP pulse duration $t_S$ fully overlaps the LBP pulse duration $t_L$ and $t_S$ is equal to $t_L$ in one embodiment. As shown, the SP pulse duration $t_S$ may precede the application of the LBP pulse. Additionally, in some cases the SP pulse duration is may extend past the end of the LBP pulse.

The plasma processing method 100 further includes a second phase 2 during which an HBP pulse with higher-frequency RF frequency $f_H$ (an HBP pulse) for an HBP pulse duration $t_H$. The application of the HBP pulse occurs after the first phase 1. In one embodiment, the HBP pulse is applied directly after the end of the SP pulse. In other embodiments, a delay may be introduced between the SP pulse and the HBP pulse.

The LBP pulse frequency $f_L$ is less than the HBP pulse frequency $f_H$. In some embodiments the LBP pulse frequency $f_L$ is less than about 2 MHz. For example, $f_L$ may be between about 0.4 to about 2 MHz, but lower frequencies are of course possible. In one embodiment, the LBP pulse frequency $f_L$ is about 1.2 MHz.

In contrast, the HBP pulse frequency $f_H$ is greater than about 3 MHz in some embodiments. In various embodiments, $f_H$ is in the high frequency (HF) band of the electromagnetic spectrum ranging from 3 MHz to 30 MHz. However, the HBP pulse frequency $f_H$ may also be higher, such as in the very high frequency (VHF) band, the ultra high frequency (UHF) band, and others. In one embodiment, $f_H$ is about 13 MHz (e.g. 13.56 MHz).

Although there is no requirement that the RF frequency of the SP pulse $f_S$ be any particular frequency, it may be higher than both $f_H$ and $f_L$ in some embodiments. For example, $f_S$ may be in the HF band, the VHF band, the UHF band, and above. In one embodiment, the RF frequency of the SP pulse $f_S$ is about 26 MHz. In another embodiment, the RF frequency of the SP pulse $f_S$ is about 13 MHz (e.g. 13.56 MHz).

The plasma processing method 100 does not rely on any specific power level values for the SP pulse, the LBP pulse, or the HBP pulse. However, as shown, in the first phase 1, the SP power level $P_{S1}$ and LBP power level $P_{L1}$ are greater than zero while the HBP power level $P_{H1}$ is zero. Similarly, in the second phase 2, the HBP power level $P_{H2}$ is greater than zero while the SP power level $P_{S2}$ and the LBP power level $P_{L2}$ are reduced (e.g. to zero as depicted, but this is not a strict requirement).

Referring now to FIG. 1B, the first phase 1 may be a deposition phase and may be characterized by the generation of low-energy ions 164 at a workpiece 102. The workpiece 102 includes a substrate 160. The substrate 106 may be any suitable substrate for which plasma processing is desired. The low-energy ions 164 may facilitate the deposition of a passivating layer 162. The passivating layer 162 may be advantageously selectively deposited at top surfaces 163 of features of the substrate 160. For example, the low-energy ions 164 may be substantially thermal resulting in reduced penetration into narrow features of the substrate 160 which may result in the desired selective behavior. In some embodiments, the features of the substrate 160 are fins and the plasma processing method 200 is a gate etch (a soft-landing step for gate etching in one particular embodiment).

The second phase 2 may be an etching phase and include high-energy ions 166. The high-energy ions 166 may have considerable vertical velocity compared to the near-thermal low-energy ions 164 of the first phase 1. This verticality of the high-energy ions 166 may result in etching of the substrate to an etch depth 168. Because the high-energy ions 166 are substantially vertical, they reach the bottom of the features with minimal undesirably interaction with sidewalls. However, the top surfaces 163 of the features are exposed to the high-energy ions 166. The selective deposition of the passivating layer 162 may advantageously protect the top surfaces 163 of features from undesirable effects such as recess.

Figure 2:
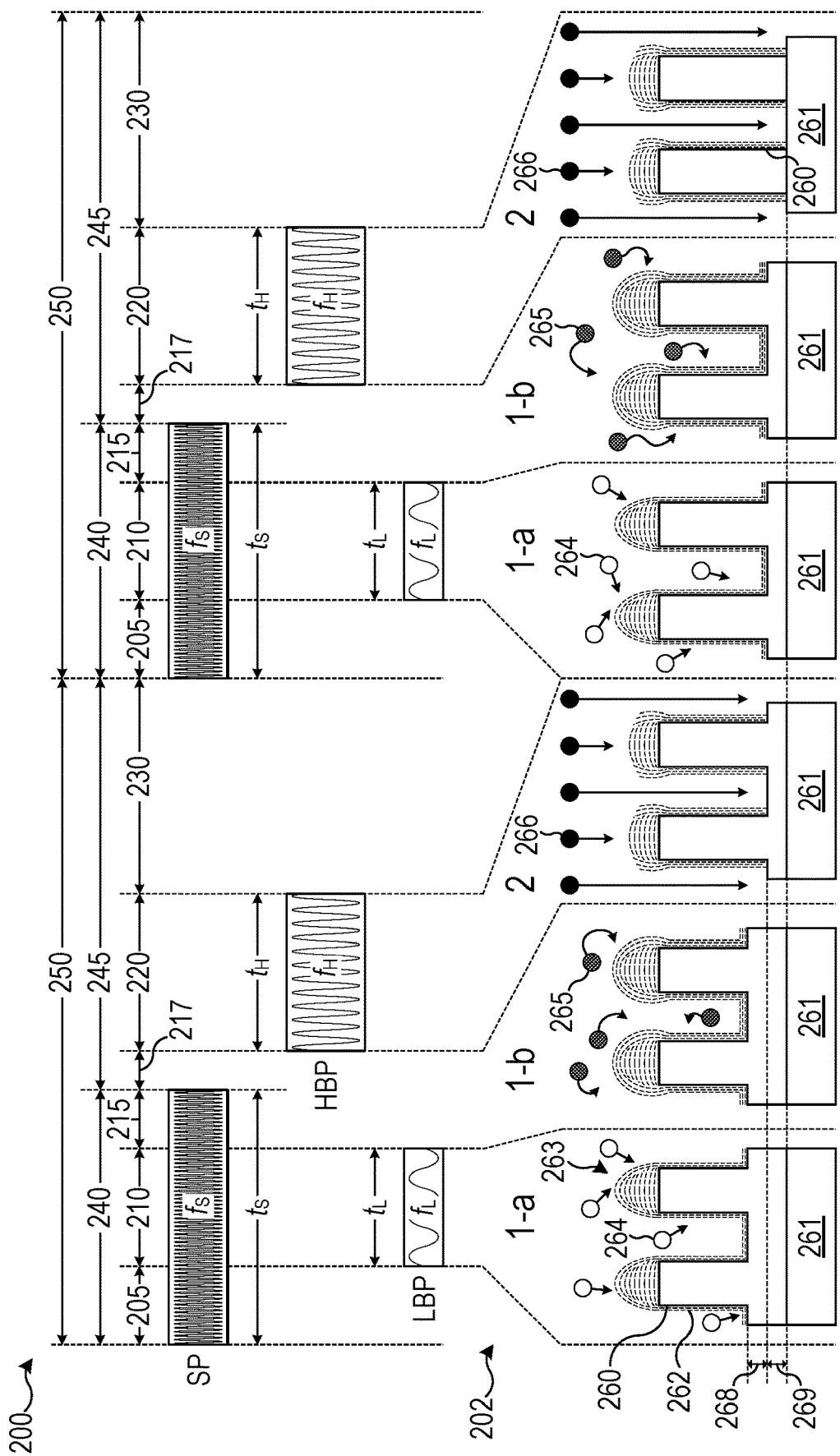
FIG. 2 illustrates a schematic timing diagram and a corresponding target substrate of another example plasma processing method in accordance with embodiments of the invention.

FIG. 2 illustrates a schematic timing diagram and a corresponding target substrate of another example plasma processing method in accordance with embodiments of the invention. The plasma processing method of FIG. 2 may be a specific implementation of other plasma processing methods described herein such as the plasma processing method of FIG. 1, for example. Similarly labeled elements may be as previously described.

Referring to FIG. 2, a plasma processing method 200 includes SP pulses, LBP pulses, and HBP pulses applied at respective frequencies and durations to process a workpiece 202. It should be noted that here and in the following a convention has been adopted for brevity and clarity wherein elements adhering to the pattern [x02] may be related implementations of a workpiece in various embodiments. For example, the workpiece 202 may be similar to the workpiece 102 except as otherwise stated. An analogous convention has also been adopted for other elements as made clear by the use of similar terms in conjunction with the aforementioned three-digit numbering system.

The plasma processing method 200 is a cyclical process where the cycle 250 is repeated until the desired processing effect is achieved (e.g. etching regions of a substrate 260 to a desired depth). Each cycle 250 includes a glow phase 240 and an afterglow phase 245 which corresponds with the application of the SP pulse. That is, during the SP pulse duration $t_S$, plasma (e.g. a high density plasma) in a glow phase is generated which rapidly transitions into an afterglow phase after the SP pulse (i.e. the source power is removed).

During the glow phase 240 caused the SP pulse, an LBP pulse is applied during a low-energy ion generation phase 210. Optionally, the SP pulse may begin before the LBP pulse resulting in a plasma generation phase 205 during which no LBP is applied. When the SP pulse extends beyond the LBP pulse, a redeposition phase 215 is created.

The HBP pulse is applied in an etch phase 220 during the afterglow phase 245. An optional delay phase 217 may be utilized as part of the afterglow phase 245 to delay the application of the HBP pulse after the SP pulse ends (e.g. to allow the plasma to cool a desired amount). Also in the afterglow phase 245, an optional pumping phase 230 may be included to remove by-products in preparation for the next glow phase 240.

During the cycle 250 the plasma processing method 200 iterates through a deposition phase (divided into sub-phases 1-a and 1-b) and an etching phase 2. As shown, the substrate 260 of the workpiece 202 (which may include an underlying layer 261). In phase 1-a, low-energy ions 264 are generated at the substrate 260 which assist in deposition of a passivating layer 262 on surfaces of the substrate 260. As before, the passivating layer 262 is selectively deposited at top surfaces 263 of features of the substrate 260 (e.g. fins). In phase 1-b, deposition continues as by-products 265 (e.g. from mild etching by the low-energy ions 264) are dissociated and redeposited.

The buildup of the passivating layer 262 protects the features in phase 2 while high-energy ions 266 reach the bottom of the features and etch the substrate 260 to a first etch depth 268. In this example, the first etch depth 268 is not an end point of the plasma processing method 200. As illustrated, phases 1-a, 1-b, and 2 are repeated to etch the substrate 260 to a second etch depth 269. For the purposes of illustration, this may be the end point of the plasma processing method 200 as the underlying layer 261 has been reached (although etching through the underlying layer is also possible). The number of iterations of the cycle 250 may more than two (e.g. much more) and will depend on the specific details of a given application.

Figure 3:
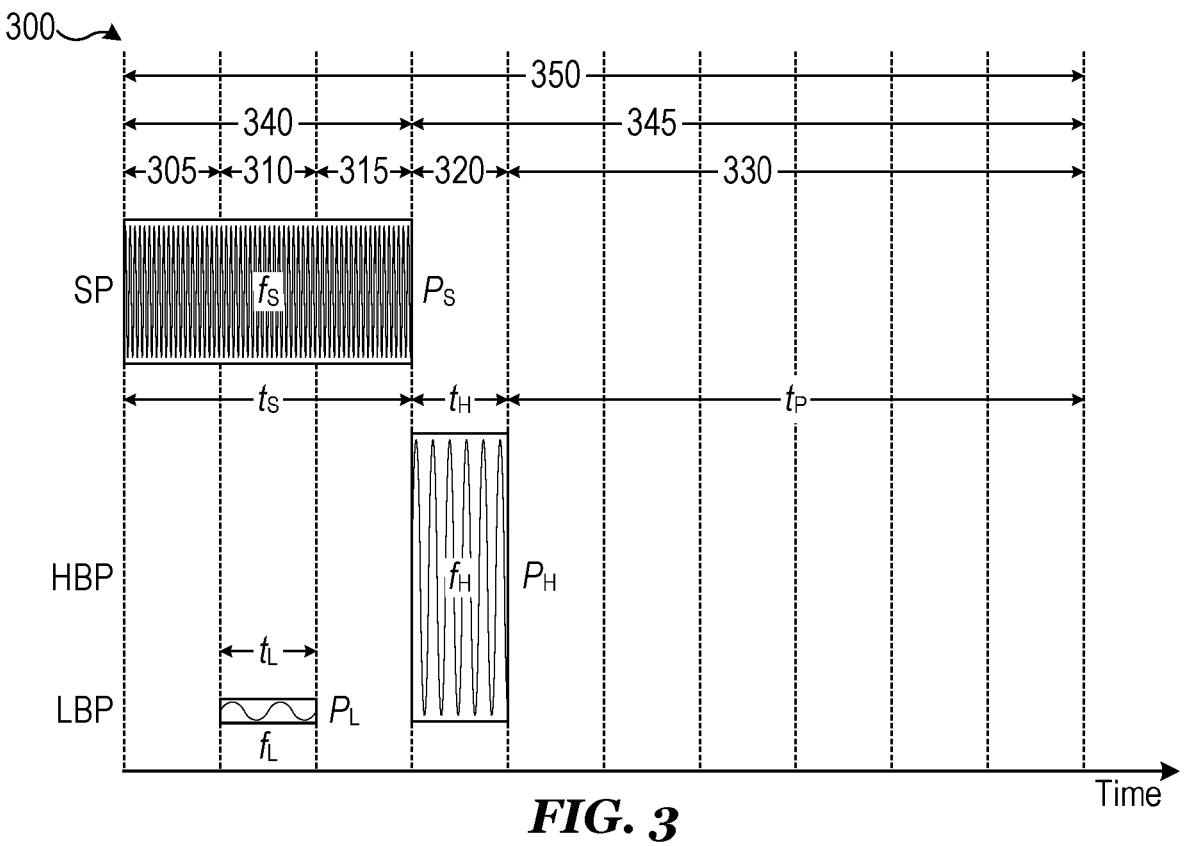
FIG. 3 illustrates a schematic timing diagram of still another example plasma processing method in accordance with embodiments of the invention.

FIG. 3 illustrates a schematic timing diagram of yet another example plasma processing method in accordance with embodiments of the invention. The plasma processing method of FIG. 3 may be a specific implementation of other plasma processing methods described herein such as the plasma processing method of FIG. 1, for example. Similarly labeled elements may be as previously described.

Referring to FIG. 3, a plasma processing method 300 includes a cycle 350 which includes a glow phase 340 and an afterglow phase 345. The plasma processing method 300 may be a specific implementation of the plasma processing method 200 of FIG. 2, for example, in which relative power levels and duty cycles (i.e. percentage of on time of a pulse during a cycle) of the SP pulses, LBP pulses, and HBP pulses are provided.

In this specific example, the LBP power level $P_L$ during the low-energy ion generation phase 340 is much less than the HBP power level $P_H$ during the etch phase 320. For example, $P_H$ may be at least three times $P_L$ as shown. In one embodiment, $P_H$ is twelve times $P_L$. In various embodiments, $P_L$ is less than about 100 W and is about 50 W in one embodiment. Similarly, in various embodiments, $P_H$ is greater than about 250 W (e.g. between 250 W and moo W, although higher is possible). In one embodiment, $P_H$ is about 600 W.

The SP power level $P_S$ is in between the LBP power level $P_L$ and the HBP power level $P_H$ in this example. For example, $P_S$ may be about half of $P_H$ in some implementations. In various embodiments, $P_S$ is greater than about 200 W is about 300 W in one embodiment.

In this specific implementation, the duration of the delay phase is zero resulting in the etch phase 320 immediately following the redeposition phase 315. The optional pumping phase 330 is utilized and has a pumping duration $t_P$ corresponding to an off time that has a duty cycle of 60% (i.e. 60% of each iterated cycle 350). Comparatively, the duty cycle of both the LBP pulse is 10% and the HBP pulse is 10% while the duty cycle of the SP pulse is 30%.

Of course, the specifics of these duty cycles and the pulse delays within the cycle will depend on the specific details of a given application. Further, the duty cycles, power levels, frequencies, delays, and other parameters may be made dynamic if desired (varying from cycle to cycle within the same plasma processing method).

Figure 4:
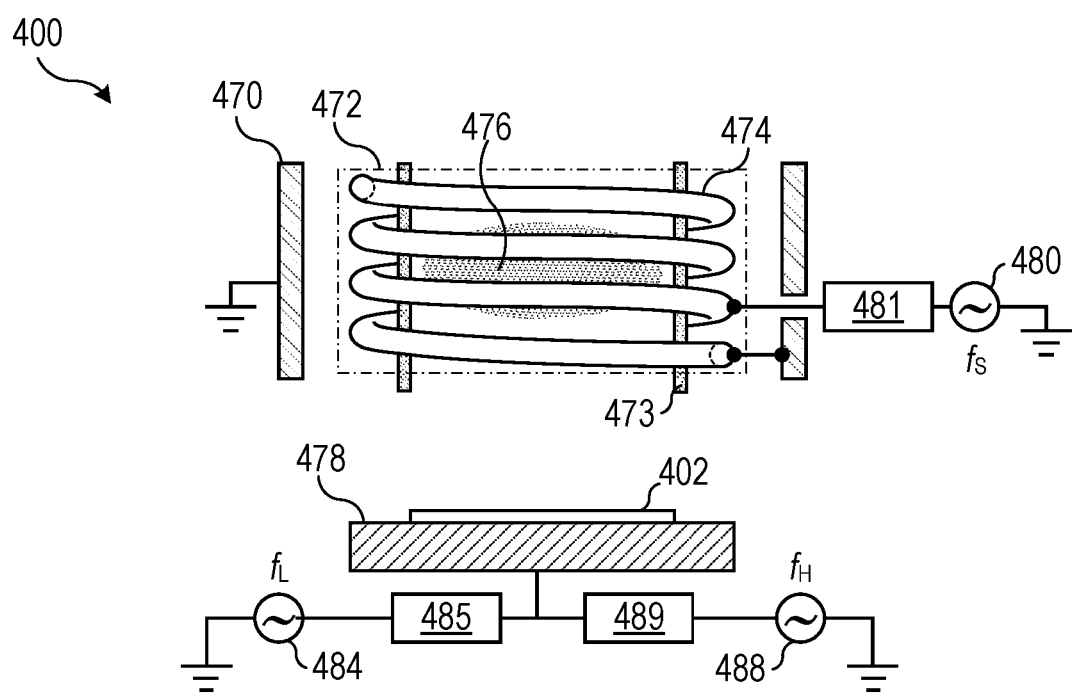
FIG. 4 illustrates a schematic diagram of an example plasma processing apparatus in accordance with embodiments of the invention.

FIG. 4 illustrates a schematic diagram of an example plasma processing apparatus in accordance with embodiments of the invention. The plasma processing apparatus of FIG. 4 may be used to perform the plasma processing methods described herein, such as the plasma processing method of FIG. 1, for example. Similarly labeled elements may be as previously described.

Referring to FIG. 4, a plasma processing system 400 includes a grounded outer structure 470 surrounding a SP coupling electrode 472 (which may be implemented as a helical resonator antenna 474 which in turn surrounds a dielectric inner surface 473). The helical resonator antenna 474 may be grounded at one end and left free at the other. An RF source power supply 480 is coupled to a SP generator circuit 481 which is in turn coupled to the helical resonator antenna 474 at an appropriate distance from the grounded connection.

The source power coupling location (which may also be referred to as a tap position) may depend on operating frequency as well as other considerations. A plasma 476 (which may be a high-density plasma such as a helical resonator plasma as shown) is generated which is inductively coupled to the SP coupling electrode 472. For example, the dielectric inner surface 473 may be provided between the plasma 476 and the helical resonator antenna 474 to facilitate inductive coupling. An RF LBP supply 484 may be coupled to an LBP generator circuit 485 which is coupled to a substrate support 478 (e.g. a lower plate electrode (LEL). The substrate support 478 may serve as an electrostatic chuck (ESC) to support and retain a substrate 402.

The helical resonator antenna 474 may be a full-wave, half-wave, or quarter-wave antenna. For example, if the helical resonator antenna 474 is driven at using RF power with a frequency of about 26 MHz, a quarter-wave helical resonator antenna may be about 2.25 m in length. Similarly, if the helical resonator antenna 474 is driven at using RF power with a frequency of 13.56 MHz, a quarter-wave helical resonator antenna may be about 5.5 m in length. As the RF frequency increases, the length of the helical resonator antenna 474 may decrease. For example, a quarter-wave helical resonator antenna driven at about 50 MHz may be about 1.5 m in length.

Figure 5:
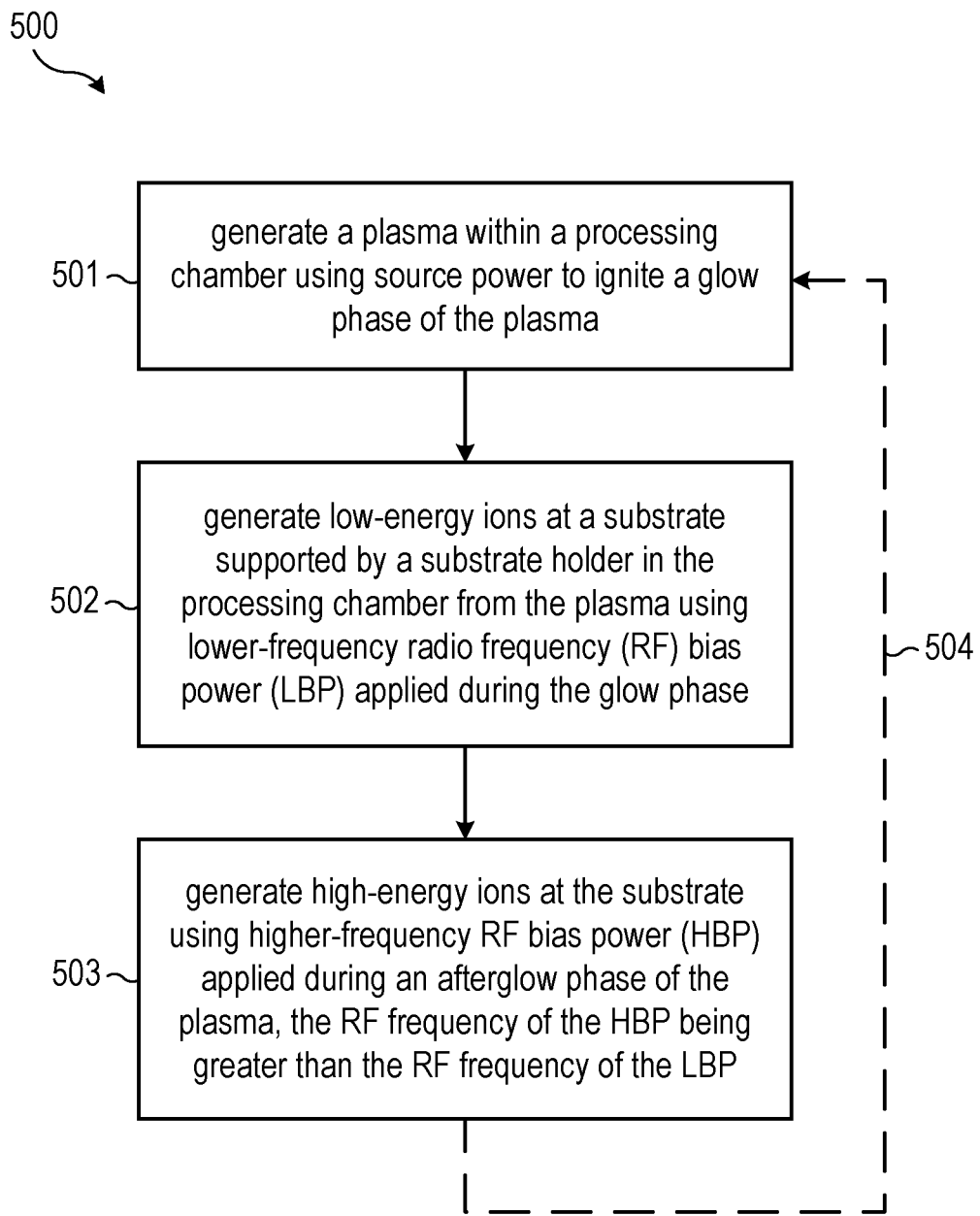
FIG. 5 illustrates an example method of plasma processing in accordance with embodiments of the invention.

FIG. 5 illustrates an example method of plasma processing in accordance with embodiments of the invention. The method of FIG. 5 may be combined with other methods and performed using the systems and apparatuses as described herein. For example, the method of FIG. 5 may be combined with any of the embodiments of FIGS. 1A, 1B, and 2-4. Although shown in a logical order, the arrangement and numbering of the steps of FIG. 5 are not intended to be limited. The method steps of FIG. 5 may be performed in any suitable order or concurrently with one another as may be apparent to a person of skill in the art.

Referring to FIG. 5, a method 500 of plasma processing includes step 501 of generating a plasma within a processing chamber using source power to ignite a glow phase of the plasma. During the glow phase of the plasma, low-energy ions are generated at a substrate supported by a substrate holder in the processing chamber from the plasma using lower-frequency RF bias power in step 502.

After the glow phase (i.e. after the source power has been removed), the plasma is in an afterglow phase. Step 503 is to generate high-energy ions at the substrate using higher-frequency RF bias power applied during the afterglow phase of the plasma. The RF frequency of the higher-frequency RF bias power (e.g. in the HF band ranging from 3 MHz to 30 MHz) is greater than the RF frequency of the lower-frequency RF bias power (e.g. less than about s MHz). Optionally, step 501, step 502, and step 503 may then be repeated, shown as step 504, for some number of times to achieve a desired result (i.e. cyclically performed as a cycle).

Figure 6:
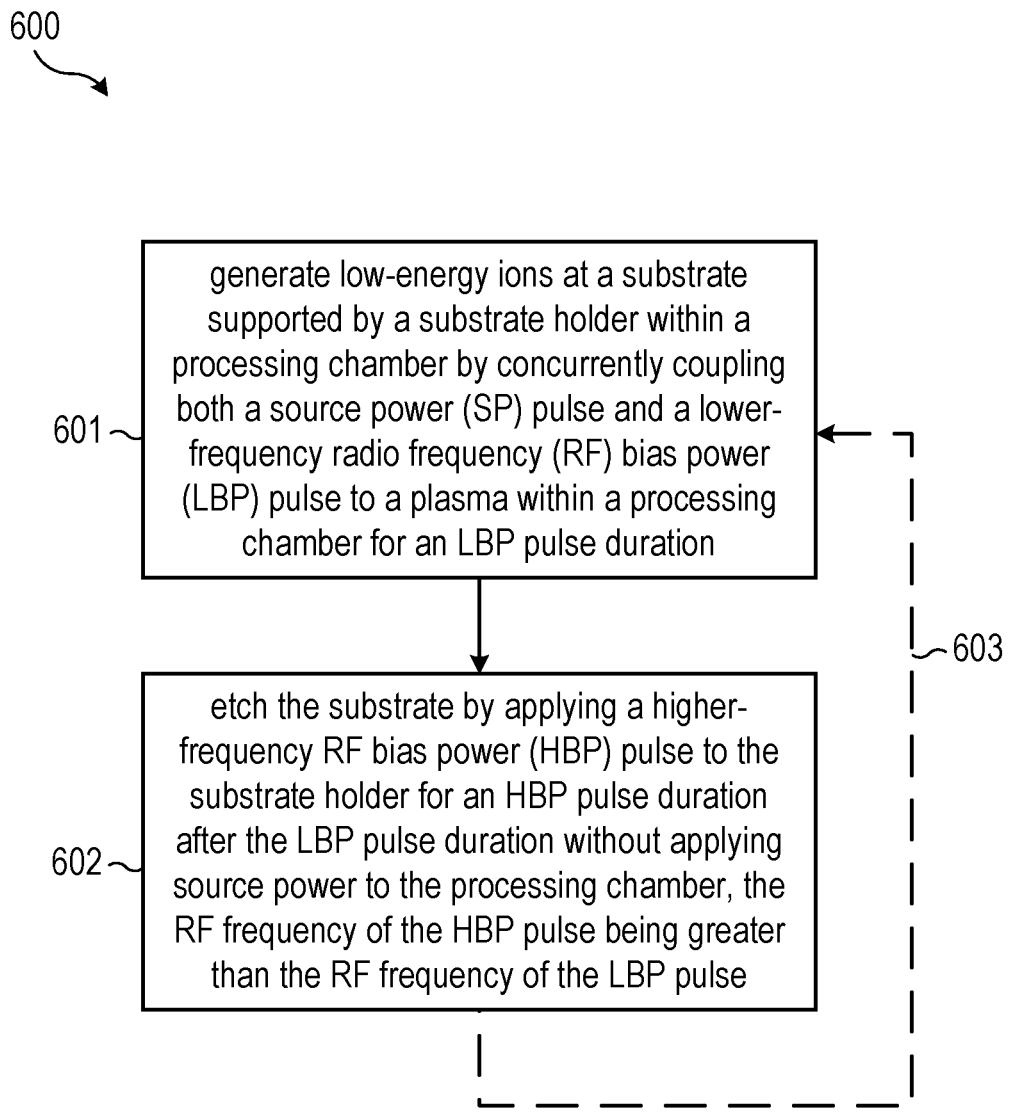
FIG. 6 illustrates another example method of plasma processing in accordance with embodiments of the invention.

FIG. 6 illustrates another example method of plasma processing in accordance with embodiments of the invention. The method of FIG. 6 may be combined with other methods and performed using the systems and apparatuses as described herein. For example, the method of FIG. 6 may be combined with any of the embodiments of FIGS. 1A, 1B, and 2-4. Additionally, the method of FIG. 6 may be combined with other methods, such as the method of FIG. 5, for example. Although shown in a logical order, the arrangement and numbering of the steps of FIG. 6 are not intended to be limited. The method steps of FIG. 6 may be performed in any suitable order or concurrently with one another as may be apparent to a person of skill in the art.

Referring to FIG. 6, a method 600 of plasma etching includes step 601 of generating low-energy ions at a substrate supported by a substrate holder within a processing chamber. The low-energy ions are generated by concurrently coupling both a source power pulse and a lower-frequency RF bias power pulse to a plasma within a processing chamber for a first pulse duration.

After the low-energy ions are generated, the substrate is etched in step 602 by applying a higher-frequency RF bias power pulse to the substrate holder for a second pulse duration after the first pulse duration. The higher-frequency RF bias power pulse is applied without applying source power to the processing chamber.

The RF frequency of the higher-frequency RF bias power (e.g. in the HF band ranging from 3 MHz to 30 MHz) is greater than the RF frequency of the lower-frequency RF bias power (e.g. less than about s MHz). Optionally, step 501, step 502, and step 503 may then be repeated, shown as step 504, for some number of times to achieve a desired result (i.e. cyclically performed as a cycle). Optional step 603 is to repeat step 601 and step 602 for some number of times to achieve a desired result (i.e. cyclically performed as a cycle).

Figure 7:
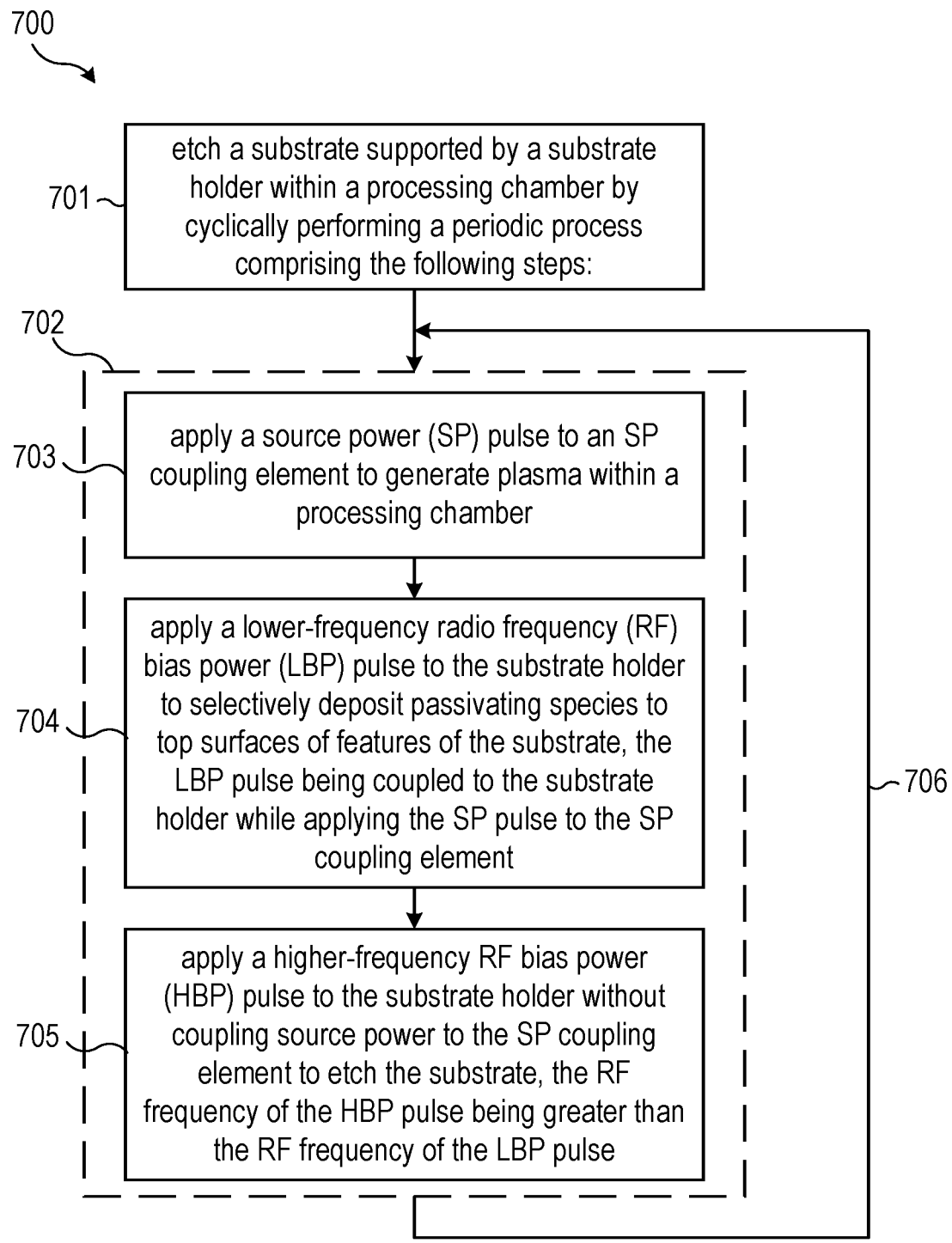
FIG. 7 illustrates an example method of plasma processing in accordance with embodiments of the invention.

FIG. 7 illustrates an example method of plasma processing in accordance with embodiments of the invention. The method of FIG. 7 may be combined with other methods and performed using the systems and apparatuses as described herein. For example, the method of FIG. 7 may be combined with any of the embodiments of FIGS. 1A, 1B, and 2-4. Additionally, the method of FIG. 7 may be combined with other methods, such as either of the methods of FIGS. 5 and 6, for example. Although shown in a logical order, the arrangement and numbering of the steps of FIG. 7 are not intended to be limited. The method steps of FIG. 7 may be performed in any suitable order or concurrently with one another as may be apparent to a person of skill in the art.

Referring to FIG. 7, a method 700 of plasma etching includes step 701 of etching a substrate supported by a substrate holder within a processing chamber by cyclically performing 706 a periodic process 702. The periodic process 702 includes step 703, step 704, and step 705.

Step 703 is to apply a source power pulse to a source power coupling element to generate plasma within a processing chamber. In step 704, a lower-frequency RF bias power pulse is applied to the substrate holder to selectively deposit passivating species to top surfaces of features of the substrate. The lower-frequency RF bias power pulse is coupled to the substrate holder while applying the SP pulse to the SP coupling element.

A higher-frequency RF bias power pulse is applied to the substrate holder without coupling source power to the source power coupling element to etch the substrate in step 705. The RF frequency of the higher-frequency RF bias power (e.g. in the HF band ranging from 3 MHz to 30 MHz) is greater than the RF frequency of the lower-frequency RF bias power (e.g. less than about 2 MHz).

Example embodiments of the invention are summarized here. Other embodiments can also be understood from the entirety of the specification as well as the claims filed herein.

Example 1. A plasma processing method including: generating a plasma within a processing chamber using source power to ignite a glow phase of the plasma; generating low-energy ions at a substrate supported by a substrate holder in the processing chamber from the plasma using lower-frequency RF bias power (LBP) applied during the glow phase; and generating high-energy ions at the substrate using higher-frequency RF bias power (HBP) applied during an afterglow phase of the plasma, the RF frequency of the HBP being greater than the RF frequency of the LBP.

Example 2. The plasma processing method of example 1, where generating the glow phase includes applying source power to generate the plasma prior to generating the low-energy ions and continuing to apply the source power while generating the low-energy ions.

Example 3. The plasma processing method of examples 1 and 2, where generating the glow phase includes applying source power to dissociate and redeposit etching by-products after generating the low-energy ions and before generating the high-energy ions.

Example 4. The plasma processing method of one of examples 1 to 3, where the RF frequency of the LBP is less than about 2 MHz; and where the RF frequency of the HBP is in the high frequency (HF) band ranging from 3 MHz to 30 MHz.

Example 5. The plasma processing method of example 4, where the power level of the LBP is less than about wo W; and where the power level of the HBP is at least about three times the power level of the LBP.

Example 6. A plasma etching method including: generating low-energy ions at a substrate supported by a substrate holder within a processing chamber by concurrently coupling both an SP pulse and an LBP pulse to a plasma within a processing chamber for an LBP pulse duration; and etching the substrate by applying an HBP pulse to the substrate holder for an HBP pulse duration after the LBP pulse duration without applying source power to the processing chamber, the RF frequency of the HBP pulse being greater than the RF frequency of the LBP pulse.

Example 7. The plasma etching method of example 6, further including: applying no source power or bias power to the processing chamber for a delay duration after the LBP duration and before the HBP duration.

Example 8. The plasma etching method of one of examples 6 and 7, further including: applying the SP pulse to an SP coupling element before the LBP pulse duration to generate the plasma.

Example 9. The plasma etching method of one of examples 6 to 8, further including: applying the SP pulse to the plasma for an SP duration after the LBP pulse duration and before the HBP pulse duration.

Example 10. The plasma etching method of one of examples 6 to 9, where the RF frequency of the LBP pulse is less than about 2 MHz.

Example 11. The plasma etching method of example 10, where the RF frequency of the LBP pulse is about 1.2 MHz.

Example 12. The plasma etching method of one of examples 6 to 11, where the power level of the LBP pulse is less than about wo W.

Example 13. The plasma etching method of example 12, where the power level of the HBP pulse is greater than the power level of the LBP pulse, the power level of the SP pulse being therebetween.

Example 14. A plasma processing method including etching a substrate supported by a substrate holder within a processing chamber by cyclically performing a periodic process including the following steps: applying an SP pulse to an SP coupling element to generate plasma within a processing chamber; applying an LBP pulse to the substrate holder to selectively deposit passivating species to top surfaces of features of the substrate, the LBP pulse being coupled to the substrate holder while applying the SP pulse to the SP coupling element; and applying an HBP pulse to the substrate holder without coupling source power to the SP coupling element to etch the substrate, the RF frequency of the HBP pulse being greater than the RF frequency of the LBP pulse.

Example 15. The plasma processing method of example 14, where applying the LBP pulse to the substrate to selectively deposit the passivating species includes: applying the LBP pulse to the substrate while applying the SP pulse to generate low-energy ions at the substrate; and continuing to apply the SP pulse to an SP coupling element after applying the LBP pulse to dissociate species for deposition as passivating species to the top surfaces of the features of the substrate.

Example 16. The plasma processing method of example 15, where the periodic process further includes: applying no source power or bias power to the processing chamber for a predetermined duration after applying the HBP pulse to the substrate holder.

Example 17. The plasma processing method of example 16, where the SP pulse is periodically applied during the periodic process with a duty cycle of less than 50%; and where both the LBP pulse and the HBP pulse are periodically applied during the periodic process with respective duty cycles of less than 25%.

Example 18. The plasma processing method of example 17, where the period of the periodic process is between about 1 ms and about 100 ms.

Example 19. The plasma processing method of one of examples 14 to 18, where the RF frequency of the LBP pulse is less than about 2 MHz.

Example 20. The plasma processing method of example 19, where the power level of the LBP pulse is less than about 100 W; and where the power level of the HBP pulse is greater than the power level of the LBP pulse, the power level of the SP pulse being therebetween.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing method comprising:
generating a plasma within a processing chamber using source power to ignite a glow phase of the plasma;
generating low-energy ions at a substrate supported by a substrate holder in the processing chamber from the plasma using lower-frequency radio frequency (RF) bias power (LBP) applied during the glow phase; and
generating high-energy ions at the substrate using higher-frequency RF bias power (HBP) applied during an afterglow phase of the plasma, the RF frequency of the HBP being greater than the RF frequency of the LBP.

2. The plasma processing method of claim 1, wherein generating the glow phase comprises applying source power to generate the plasma prior to generating the low-energy ions and continuing to apply the source power while generating the low-energy ions.

3. The plasma processing method of claim 1 wherein generating the glow phase comprises applying source power to dissociate and redeposit etching by-products after generating the low-energy ions and before generating the high-energy ions.

4. The plasma processing method of claim 1,
wherein the RF frequency of the LBP is less than about 2 MHz; and
wherein the RF frequency of the HBP is in the high frequency (HF) band ranging from 3 MHz to 30 MHz.

5. The plasma processing method of claim 4,
wherein the power level of the LBP is less than about 100 W; and
wherein the power level of the HBP is at least about three times the power level of the LBP.

6. A plasma etching method comprising:
generating low-energy ions at a substrate supported by a substrate holder within a processing chamber by concurrently coupling both a source power (SP) pulse and a lower-frequency radio frequency (RF) bias power (LBP) pulse to a plasma within the processing chamber for an LBP pulse duration; and
etching the substrate by applying a higher-frequency RF bias power (HBP) pulse to the substrate holder for an HBP pulse duration after the LBP pulse duration without applying source power to the processing chamber, the RF frequency of the HBP pulse being greater than the RF frequency of the LBP pulse.

7. The plasma etching method of claim 6, further comprising:
applying no source power or bias power to the processing chamber for a delay duration after the LBP duration and before the HBP duration.

8. The plasma etching method of claim 6, further comprising:
applying the SP pulse to an SP coupling element before the LBP pulse duration to generate the plasma.

9. The plasma etching method of claim 6, further comprising:
applying the SP pulse to the plasma for an SP duration after the LBP pulse duration and before the HBP pulse duration.

10. The plasma etching method of claim 6, wherein the RF frequency of the LBP pulse is less than about 2 MHz.

11. The plasma etching method of claim 10, wherein the RF frequency of the LBP pulse is about 1.2 MHz.

12. The plasma etching method of claim 6, wherein the power level of the LBP pulse is less than about 100 W.

13. The plasma etching method of claim 12, wherein the power level of the HBP pulse is greater than the power level of the LBP pulse, the power level of the SP pulse being therebetween.

14. A plasma processing method comprising etching a substrate supported by a substrate holder within a processing chamber by cyclically performing a periodic process comprising the following steps:
applying a source power (SP) pulse to an SP coupling element to generate a plasma within the processing chamber;
applying a lower-frequency radio frequency (RF) bias power (LBP) pulse to the substrate holder to selectively deposit passivating species to top surfaces of features of the substrate, the LBP pulse being coupled to the substrate holder while applying the SP pulse to the SP coupling element; and
applying a higher-frequency RF bias power (HBP) pulse to the substrate holder without coupling source power to the SP coupling element to etch the substrate, the RF frequency of the HBP pulse being greater than the RF frequency of the LBP pulse.

15. The plasma processing method of claim 14, wherein applying the LBP pulse to the substrate to selectively deposit the passivating species comprises:
applying the LBP pulse to the substrate while applying the SP pulse to generate low-energy ions at the substrate; and
continuing to apply the SP pulse to the SP coupling element after applying the LBP pulse to dissociate species for deposition as passivating species to the top surfaces of the features of the substrate.

16. The plasma processing method of claim 15, wherein the periodic process further comprises:
applying no source power or bias power to the processing chamber for a predetermined duration after applying the HBP pulse to the substrate holder.

17. The plasma processing method of claim 16,
wherein the SP pulse is periodically applied during the periodic process with a duty cycle of less than 50%; and
wherein both the LBP pulse and the HBP pulse are periodically applied during the periodic process with respective duty cycles of less than 25%.

18. The plasma processing method of claim 17, wherein the period of the periodic process is between about 1 ms and about 100 ms.

19. The plasma processing method of claim 14, wherein the RF frequency of the LBP pulse is less than about 2 MHz.

20. The plasma processing method of claim 19,
wherein the power level of the LBP pulse is less than about 100 W; and
wherein the power level of the HBP pulse is greater than the power level of the LBP pulse, the power level of the SP pulse being therebetween.

* * * * *